United States Patent
Xue et al.

(10) Patent No.: US 9,279,873 B2
(45) Date of Patent: Mar. 8, 2016

(54) SELF CONSISTENT PARALLEL IMAGING WITH TEMPORAL SENSITIVITY ESTIMATION IN REAL-TIME MAGNETIC RESONANCE IMAGING

(75) Inventors: Hui Xue, Franklin Park, NJ (US); Yu Ding, Columbus, OH (US)

(73) Assignee: SIEMENS CORPORATION, Iselin, NJ (US)

(*) Notice: Subject to any disclaimer, the term of this patent is extended or adjusted under 35 U.S.C. 154(b) by 915 days.

(21) Appl. No.: 13/534,112

(22) Filed: Jun. 27, 2012

(65) Prior Publication Data

US 2013/0027037 A1 Jan. 31, 2013

Related U.S. Application Data

(60) Provisional application No. 61/512,629, filed on Jul. 28, 2011.

(51) Int. Cl.
*G01V 3/00* (2006.01)
*G01R 33/561* (2006.01)
*G01R 33/565* (2006.01)

(52) U.S. Cl.
CPC ...... *G01R 33/5611* (2013.01); *G01R 33/56509* (2013.01)

(58) Field of Classification Search
CPC .................................................. G01R 33/5611
USPC ........................................ 324/309, 307, 306
See application file for complete search history.

(56) References Cited

U.S. PATENT DOCUMENTS

| 7,777,487 | B2* | 8/2010 | Ying et al. | 324/309 |
|---|---|---|---|---|
| 2002/0097050 | A1* | 7/2002 | Kellman et al. | 324/309 |
| 2002/0167315 | A1* | 11/2002 | Kellman et al. | 324/307 |
| 2011/0234222 | A1* | 9/2011 | Frahm et al. | 324/309 |

OTHER PUBLICATIONS

D. J. Larkman, et al., Parallel magnetic resonance imaging, Physics in Medicine and Biology, 52, 2007.
K. P. Pruessmann, et al., SENSE: Sensitivity Encoding for Fast MRI, Magnetic Resonance in Medicine, 42, p. 952, 1999.
M. A. Griswold, et al., Generalized Autocalibrating Partially Parallel Acquisitions (GRAPPA)Magnetic Resonance in Medicine, 47, p. 1202, 2002.
M. Lustig, et al., SPIRiT: Iterative Self-consistent Parallel Imaging Reconstruction From Arbitrary k-Space, Magnetic Resonance in Medicine, 64, p. 457, 2010.
S. S. Vasanwala, et al., Improved Pediatric MR Imaging with Compressed Sensing, Radiology, 256, p. 607, 2010.
Y. Ding, et al., A New Approach to Autocalibrated Dynamic Parallel Imaging Based on the Karhunen-Loeve Transform: KL-TSENSE and KL-TGRAPPA,Magnetic Resonance in Medicine, 65, p. 1786, 2011.

* cited by examiner

Primary Examiner — Louis Arana

(57) ABSTRACT

Parallel imaging magnetic resonance reconstruction is performed with temporal sensitivity. Rather than estimate the coil sensitivity once for each coil of an array, the coil sensitivity at different times is estimated. The movement of the patient may result in different sensitivities at different times. By using the time varying sensitivity in iterative, self-consistent, non-linear parallel imaging, real-time imaging may be provided with stable artifacts in view of increasing SNR even with higher reduction factors (e.g., 4-6).

20 Claims, 3 Drawing Sheets

 
FIG. 5A    FIG. 5B
 
FIG. 5C    FIG. 5D
 
FIG. 5E    FIG. 5F

SELF CONSISTENT PARALLEL IMAGING WITH TEMPORAL SENSITIVITY ESTIMATION IN REAL-TIME MAGNETIC RESONANCE IMAGING

RELATED APPLICATIONS

The present patent document claims the benefit of the filing date under 35 U.S.C. §119(e) of Provisional U.S. Patent Application Ser. No. 61/512,629, filed Jul. 28, 2011, which is hereby incorporated by reference.

FEDERALLY SPONSORED RESEARCH OR DEVELOPMENT

The U.S. Government has a paid-up license in this invention and the right in limited circumstances to require the patent owner to license others on reasonable terms as provided by the terms of award no. R01HL102450, awarded by National Health Institute.

BACKGROUND

The present embodiments relate to magnetic resonance imaging (MRI). In particular, parallel imaging is provided.

Parallel imaging provides for fast image acquisition for MRI. Parallel imaging includes image domain approaches (e.g., SENSE) and k-space reconstruction approaches (e.g., GRAPPA). These approaches are essentially linear in the sense that unknowns (e.g., MR images or k-space points) are solved as the solution to a least-square problem (AX=b). An advantage for the linear formulation is the relatively low computational cost.

Parallel imaging may speedup the acquisition time by acquiring a less dense sampling. The speedup or field-of-view reduction factor practical for a state-of-art clinical phased array coil is limited for most applications. There is a tradeoff between signal-noise-ratio (SNR) and artifacts for linear parallel imaging. Further increase of the reduction factor (R) along the phase encoding direction results in greater artifacts.

Parallel imaging may be formulated as a nonlinear problem. Iterative Self-consistent Parallel Imaging Reconstruction (SPIRiT) is a nonlinear parallel imaging technique. In this framework, every k-space point is estimated from all surrounding points including acquired and not acquired ones. As a result, the not acquired points cannot be directly solved as a least-square solution. With proper regularization, a better trade-off between SNR and artifacts may be feasible. However, these benefits may be reduced for dynamic or real-time imaging.

BRIEF SUMMARY

By way of introduction, the preferred embodiments described below include methods, systems, instructions, and computer readable media for parallel imaging with temporal sensitivity in magnetic resonance reconstruction. Rather than estimate the coil sensitivity once for each coil of an array, the coil sensitivity at different times is estimated. The movement of the patient relative to the coil may result in different sensitivities at different times. By using the time varying sensitivity in non-linear parallel imaging, real-time imaging may be provided with stable artifacts in view of increasing SNR even with higher reduction factors (e.g., 4-6).

In a first aspect, a method is provided for parallel imaging with temporal sensitivity in magnetic resonance reconstruction. Multiple coils are used to acquire magnetic resonance data for parallel imaging over multiple phases of a physiological cycle. The magnetic resonance data represents a dynamic interior region of a patient. For each of the multiple coils and each phase, an initial reconstruction is performed. The initial reconstructions for each of the multiple coils are temporally filtered. Coil sensitivity for each of the multiple coils at each of the multiple phases is estimated from the results of the temporally filtering. A non-linear reconstruction for each of the phases is solved as a function of the coil sensitivities and the magnetic resonance data. A sequence of images representing the dynamic interior region is generated from an output of the solving.

In a second aspect, a non-transitory computer readable storage medium has stored therein data representing instructions executable by a programmed processor for parallel imaging with temporal sensitivity in magnetic resonance reconstruction. The storage medium includes instructions for estimating coil sensitivities of an array of coils at different times from an outcome of linear reconstruction and filtering, and performing iterative self-consistent parallel imaging reconstruction from k-space data received with the array of coils, the performing being a function of the coil sensitivities at the different times.

In a third aspect, a non-transitory computer readable storage medium has stored therein data representing instructions executable by a programmed processor for parallel imaging with temporal sensitivity in magnetic resonance reconstruction. The storage medium includes instructions for receiving, for coils of an array, interleaved k-space data in frames representing different phases, generating full k-space data for the frames, filtering the full k-space data, estimating self-consistent parallel imaging reconstruction kernels for the different phases from the filtered full k-space data, and solving a non-linear reconstruction from the interleaved k-space data and the kernels.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIGS. 5A, C, and E show example MR images generated by linear reconstruction, and FIGS. 5B, D, and F show example MR images generated with non-linear reconstruction using temporally changing sensitivity.

DETAILED DESCRIPTION OF THE DRAWINGS AND PRESENTLY PREFERRED EMBODIMENTS

Linear parallel imaging algorithms may not achieve higher reduction factor (e.g. reduction factor of 4 or more) due to the unfavorable tradeoff between SNR and artifacts. For real-time cine imaging applications, the images with a reduction factor of four (R4) using linear reconstruction may present SNR that is too poor for clinical usage.

To achieve better SNR while suppressing the artifacts, self consistent parallel imaging is performed with temporal sensitivity estimation (TSPIRIT). The sensitivity information is estimated from an outcome of a linear reconstruction and a transform. The SPIRiT reconstruction is then applied to unwarp every frame in the series. The algorithm may be applied to cardiac real-time cine imaging. With temporal sensitivity in non-linear reconstruction, the SNR may improve with no or slight increase of artifact levels. The SNR of R4 imaging may be comparable or higher to R3 images from linear reconstruction, while the artifacts remain stable.

The reconstruction may be fully automated. Various clinical uses may be provided, such as cardiac perfusion imaging, flow imaging, liver imaging, and other applications whose image quality is jeopardized by the noise increase due to parallel imaging.

Figure 1:
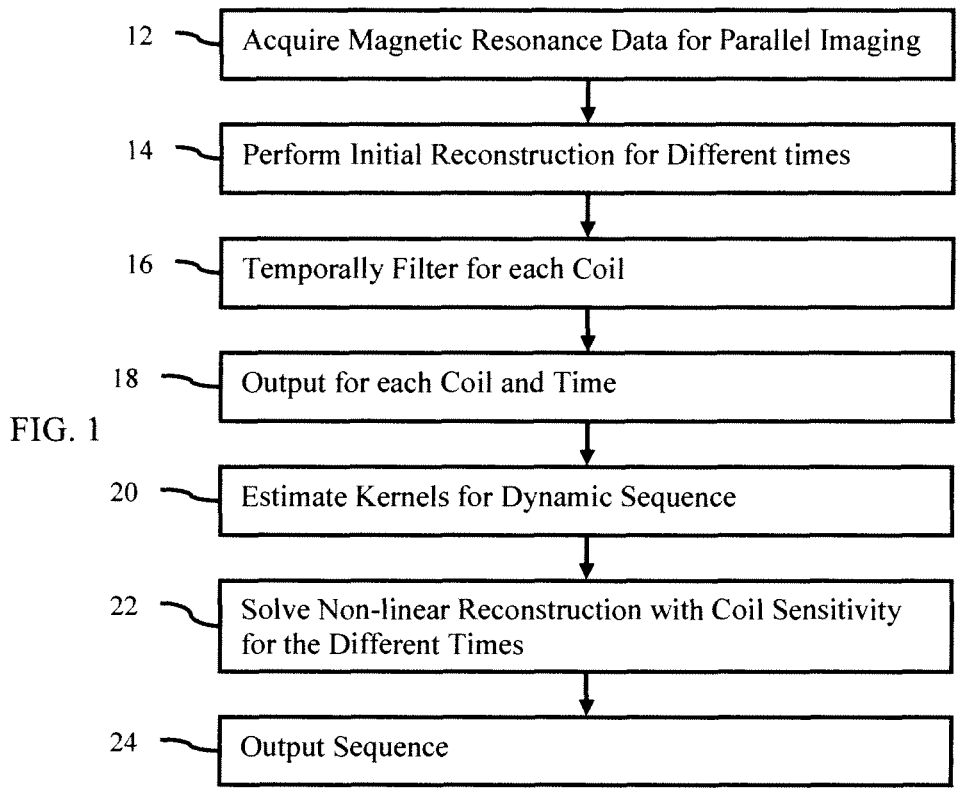
FIG. 1 is a flow chart diagram of one embodiment of a method for parallel imaging with temporal sensitivity in magnetic resonance reconstruction.

FIG. 1 shows a flow chart of a method for parallel imaging with temporal sensitivity in magnetic resonance reconstruction. Self-consistent reconstruction is applied to dynamic imaging, such as real-time cardiac cine imaging. The method is implemented by the system of FIG. 9 or another system. For example, the method is implemented on a computer or processor associated with a MRI system or PACS.

The acts are performed in the order shown or other orders. Additional, different, or fewer acts may be provided. For example, the method is performed without act 18, such as act 18 being subsumed into act 16. As another example, act 24 is not performed. In another example, the acquired data in act 12 is in object space, so act 14 is not provided.

Figure 2:
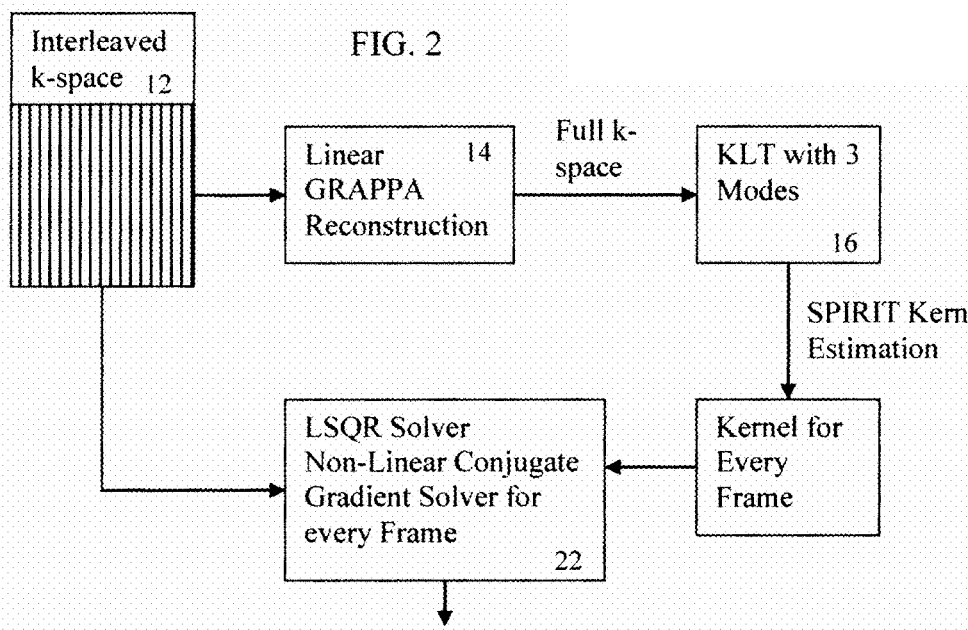
FIG. 2 is a flow chart diagram of another embodiment of a method for parallel imaging with temporal sensitivity in magnetic resonance reconstruction.

FIG. 2 shows an example implementation of the method of parallel imaging of FIG. 1. FIG. 1 represents the general temporal sensitivity framework with non-linear reconstruction. FIG. 2 shows a data flow for the temporal sensitivity framework for self-consistent non-linear reconstruction. In FIG. 2, the acquired data is processed in two paths. One path is for estimation from k-space data of coil sensitivity kernels for different coils. The different kernels provide coil sensitivity for different times during the imaging sequence. The other path uses the acquired under sampled k-space data for non-linear reconstruction based on the estimated kernels.

In act 12, magnetic resonance data is acquired. The acquired magnetic resonance data is k-space data. The MR data is acquired by scanning a patient. In response to application of magnetic fields and one or more pulses, data representing an interior region of a patient is acquired. For example, the MR data is acquired using a time-interleaved, multi-coil dynamic imaging sequence of pulses. The MR data is acquired as frames of k-space data.

K-space data is acquired for each of a plurality of coils. Each coil is used to receive data responsive to pulses applied to molecules disposed in a strong magnetic field and subjected to gradient magnetic fields. The data for each coil is received simultaneously or in response to a same pulse or shot, or the data for each coil is received sequentially.

The k-space data for each coil is associated with multiple times. Using a sequence of transmissions, MR data representing the same object at different times is acquired. A sequence of frames for each coil is acquired. The frames represent different times. The different times may or may not be associated with a physiological cycle. For example, the different times represent different phases of a heart or breathing cycle. The phases may be specific occurrences (e.g., end systole or diastole) of the heart cycle or may be different times regardless of a specific occurrence (e.g., 20 phases equally spaced in time through the cycle with or without an occurrence-linked start or end time). The magnetic resonance data represents a dynamic interior region of a patient, such as a region associated with motion. The heart, lungs, or other portion of the patient may move, contract, expand, or otherwise change over time.

To reduce the time for acquiring a given frame, the object space may be sampled in an interleaved manner. A fewer number of shots or pulses are used, but the reception is performed with multiple coils. The usage of multiple phase array coils provides parallel imaging and may provide good signal-to-noise ratio (SNR). Any reduction factor may be used, such as a reduction factor of two or more. In one embodiment, the reduction factor, R, is four, five, or six. Using parallel imaging, interleaved k-space data is received at different times by multiple coils. A frame of MR data represents the signals received for a given coil at a given time. For each coil, a sequence of frames of MR data is received to represent the respective times, such as different phases of a cycle.

In one example embodiment, a patient undergoes free-breathing real-time cardiac cine examinations using clinical 1.5T MR scanner (e.g., MAGNETOM Avanto, Siemens AG Healthcare Sector, Erlangen, Germany). One or more slices (e.g., three spatially parallel slices) or a volume (e.g., three-dimensionally spaced voxels) are acquired to cover the object of interest (e.g., the myocardium). Other MR scanners and/or imaging applications may be used. The MR sequence parameters include balanced SSFP readout, TR=1.09/TE=0.9 ms, acquired matrix 160×80 (interpolated to 160×120), flip angle 58°, interpolated in-plane resolution 2.4375×2.4375 $mm^2$, slice thickness 10 mm, and bandwidth 1420 Hz/pixel. Other settings may be used. The MR data is acquired with thirty-two coils in a phased array (e.g., a coil array from Rapid MR International, Columbus, Ohio, USA) in a time-interleaved manner. Other numbers and types of coils may be used. Scans are performed for each slice with a reduction factor of three, four, or five. The same or different reduction factor is used for each of the scans.

In act 14, an initial reconstruction is performed. The reconstruction is for each frame. Full or object space data is reconstructed from the frames of k-space data. The full space is provided for different times and different coils. For example, 640 reconstructions are generated for 640 frames associated with 32 coils and 20 phases.

The reconstruction is linear. Any linear reconstruction may be used, such as generalized auto calibrating partially parallel acquisitions (GRAPPA) reconstruction. The reconstruction is of the object space from k-space data. A full k-space is generated for each of the frames. The full k-space represents a Cartesian sampling of the object space. This outcome may present lower SNR if the reduction factor is high (e.g., greater than four for real-time cine imaging cases).

In act 16, the frames are filtered. The full k-space MR data output from the initial reconstruction is filtered.

The filtering is temporal. For each coil, the frames associated with the coil at different times are filtered. A given filtered frame is a function of at least two frames from different times. The linearly reconstructed data is filtered across the different times for each of the coils. The temporal filtering outputs filtered frames of MR data for the coils. The filtering outputs a same number of frames as input. Decimation or interpolation may be used in alternative embodiments.

In one embodiment, a Karhunen-Loeve transform is applied as the filtering. The Karhunen-Loeve filtering may suppress the noise and decrease the energy of high-frequency artifacts in the initial reconstruction. Other filtering may be used. In other embodiments, no temporal filtering is provided.

Spatial filtering may alternatively or additionally be provided. The filtering for each coil is independent of or does not use data associated with other coils. In alternative embodiments, reconstructed data from different coils are filtered together.

In act 18, the outcome from the temporal filtering of act 16 is output. The output may be internal to a computer or processor or may be by transfer to a memory or network.

All or a sub-set of the results of the filtering are output. For the Karhunen-Loeve transform, the output may be separated as modes. Higher modes may be more likely associated with noise than signal. Only MR data in lower modes, such as the first three modes, are output in one embodiment.

The output is used to estimate the coil sensitivity information. In act 20, the coil sensitivity is estimated from the regularly interleaved Cartesian k-space sampling from the outcome of the linear reconstruction and filtering. For example, the estimate is from the first three modes output by the Karhunen-Loeve transform.

The coil sensitivity is estimated for each coil. The sensitivity may be different at different times. The output frames associated with the coil are used to estimate the sensitivities. Due to changes in position of the patient or organ of the patient relative to the coils, the coil sensitivity may vary over time. The sensitivity is estimated for different times, providing temporal sensitivity. Where different frames represent different coils at particular times and groups of frames represent the same coil at different times, the coil sensitivities for each of all or some of the coils of an array are estimated for different times. By estimating the coil sensitivity for each frame, the coil sensitivities for the different coils are estimated for different times. For example, the sensitivities for thirty two different coils of an array are estimated. The sensitivities for each of these coils are estimated for each of twenty phases of a cycle.

The sensitivities represent a spatial intensity mapping. Due to differences in interaction of different tissues with the pulses, the sensitivity of a coil to signals from different locations is different. The receive ratio varies across space, resulting in receive magnitude differences. The sensitivity for each coil at the different times is estimated as a spatial matrix.

The sensitivities are estimated with an iterative self-constraint parallel imaging reconstruction calibration. Self-consistent parallel imaging reconstruction kernels are estimated for the different phases from the filtered full k-space data. The kernels are determined by calibration. For example, SPIRiT calibration is performed for every frame in the filtered full k-space. For every frame in the series, a kernel is estimated. To estimate the kernel for each frame, for every k-space point, the surrounding neighbors are used to fit into this point with kernels as weights. With a list of such linear equations for every point in the k-space, the frame specific kernel may be computed by solving these linear equations jointly.

In act 22, a non-linear reconstruction is performed. The interleaved k-space and estimated kernel are input into a non-linear solver. The reconstruction generates object space data. The object space data represents MR return of tissue.

Any non-linear reconstruction may be used. In one embodiment, the iterative self-consistent parallel imaging reconstruction (SPIRIT) is used. The k-space points are estimated from points for which data was acquired in the interleaved process and from points for which data was not acquired. The missing data correlates with the acquired data. Using this assumed correlation, a self-consistent operator may solve for the object space.

In one embodiment, the non-linear reconstruction is performed by applying a least square matrix inversion solver, such as a linear matrix inversion with LSQR. For example, the LSQR matrix inversion solver is performed and a local minima solution is estimated. Other least square or matrix inversion solvers may be used. A non-linear conjugate gradient (NCG) solver is applied to the output of the matrix inversion solver. The NCG has regularization terms added, such as a total variation term. The non-linear conjugate gradient solution is determined iteratively. Any number of iterations, including estimation and change, may be used. The final frames are output after the iteration reaches a minimum. Other solvers may be used.

The reconstruction is performed from the MR data acquired in act 12. All or a sub-set of the interleaved MR k-space data is used. The same frames used to estimate coil sensitivity prior to initial reconstruction in act 14 are reconstructed. The reconstruction is different than the initial reconstruction, such as using different data, being a different type (non-linear verses linear), or both.

The reconstruction uses the coil sensitivities via the estimated kernels. The reconstruction solution for the object space may use the focus or object space on different sides of an equation. The kernel matrix is likewise applied to both sides of the equation. In alternative embodiments, the kernel matrix is applied to one side.

Each frame is reconstructed, providing object space data representing the patient at different times from different coils. The coil sensitivity associated with a given frame is used in the reconstruction from that frame. In alternative embodiments, a coil sensitivity associated with a different frame is used in the reconstruction. Sensitivities from multiple frames, different times, and/or different coils may be used for reconstructing a given frame.

The non-linear reconstruction is performed separately for each of the phases. Object space data is generated for each of the multiple phases using the coil sensitivities for the respective phases. Through repetition, coil images for different coils are calculated. For each coil, a sequence of images or data representing object space at different times, such as different phases, is output.

In act 24, an output is generated. The reconstructed data for the different coils are combined in object space. Sum-of-square coil combination, adaptive coil combination, averaging, or other combination may be used. By combining frames for all coils or a sub-set of coils selected based on Eigen-channels, output data for a given phase or time is generated. The output data represents a magnitude of MR response of the scanned, dynamic region of the patient. A frame of output data represents the combination of frames from the different coils associated with a same or substantially same time.

A sequence of frames of such magnitude data may be generated over time from the reconstructed data of the different times. The sequence represents the patient at different times. Images generated from the data show the dynamic motion of the interior region of the patient.

The magnitude data may be further processed. For example, the magnitude data is filtered. As another example, segmentation is applied.

The output is to a memory, such as a database of a picture archiving and communication (PACS) system. The output may be a transmission, such as over a network. In one embodiment, one or more images, such as sequence of images, are generated from the reconstructed data and output. The image represents an interior region of the patient. The image is a two-dimensional image or a rendering from voxel data representing three-dimensions. The image is part of postscan imaging (i.e., not real-time) or is part of real-time cine imaging. Real-time cine imaging of the heart does not require a breath-hold and is capable of handling arrhythmia with irregular cardiac rhythm. Real-time cine imaging may be beneficial for clinical applications like stress imaging where patients may undergo pharmaceutical or exercise stress immediately before the MR acquisition and cannot hold their breath at all.

The image is displayed on a display of an MRI system. Alternatively, the image is displayed on a workstation, computer or other device. The image may be stored in and recalled from a PACS memory.

The flow of FIGS. 1 and/or 2 may be implemented as a program. For example, the flow is implemented as a mixture of C++ and Matlab, but other languages may be used. The general matrix inversion solver is implemented using Matlab by calling a supplied LSQR function. The typical time cost for the LSQR solver is around three to four seconds for NCG. The total variation term is added, but other regularization terms may be applied.

Figure 3:
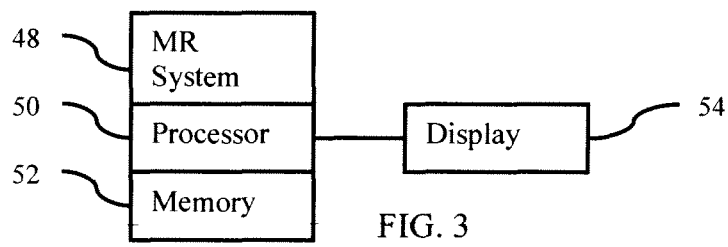
FIG. 3 is a block diagram of one embodiment of a system for parallel imaging with temporal sensitivity in magnetic resonance reconstruction.

FIG. 3 shows a system for parallel imaging with temporal sensitivity in magnetic resonance reconstruction. The system includes an MR system 48, a memory 52, a processor 50, and a display 54. Additional, different, or fewer components may be provided. For example, a network or network connection is provided, such as for networking with a medical imaging network or data archival system. In another example, a user interface is provided.

The processor 50 and display 54 are part of a medical imaging system, such as the MR system 48. Alternatively, the processor 50 and display 54 are part of an archival and/or image processing system, such as associated with a medical records database workstation or server. In other embodiments, the processor 50 and display 54 are a personal computer, such as desktop or laptop, a workstation, a server, a network, or combinations thereof. The processor 50, display 54, and memory 52 may be provided without other components for implementing temporal sensitivity in non-linear reconstruction for parallel imaging. For example, the processor 50 and memory 52 are part of a dual-core desktop with 3.00 GHz computer processing unit (CPU) and 6 GB RAM with a Nvdia GTX 570 graphics processing unit (GPU) card (1.5 G device memory). The GPU and/or the CPU may be used as the processor 50.

The MR system 48 includes an array of coils. Any array may be used, such as arrays configured as local coils. Two or more (e.g., 32) coils are provided. In one embodiment, one or more of the coils are positioned in a vest, blanket or other structure against the patient while within a bore of the MR system 48.

The MR system 48 includes a main field magnet, such as a cryomagnet, and gradient coils. Other components may be provided, such as a body coil or processing components for planning and generating transmit pulses for the coils and for receiving and processing the received k-space data.

The memory 52 is a graphics processing memory, a video random access memory, a random access memory, system memory, random access memory, cache memory, hard drive, optical media, magnetic media, flash drive, buffer, database, combinations thereof, or other now known or later developed memory device for storing data or video information. The memory 52 is part of the MR system 48, part of a computer associated with the processor 50, part of a database, part of another system, a picture archival memory, or a standalone device.

The memory 52 stores data representing a region, at different times, of a patient. The data is MR data, such as k-space or object space data. The region is a two or three-dimensional region. The region is of any part of the patient, such as a region within the chest, abdomen, leg, head, arm, or combinations thereof. The data is from scanning the region by the MR system 48. Frames of data representing returned signals for different coils at different times are stored in one embodiment. The memory 52 may alternatively or additionally store data during processing, such as storing linearly reconstructed full k-space data, temporally filtered data, estimated kernels (e.g., temporal sensitivity data), non-linearly reconstructed data, and/or output images.

The memory 52 or other memory is alternatively or additionally a computer readable storage medium storing data representing instructions executable by the programmed processor 50 for parallel imaging with temporal sensitivity in magnetic resonance reconstruction. The instructions for implementing the processes, methods and/or techniques discussed herein are provided on non-transitory computer-readable storage media or memories, such as a cache, buffer, RAM, removable media, hard drive or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The processor 50 is a general processor, central processing unit, control processor, graphics processor, GPU, digital signal processor, three-dimensional rendering processor, image processor, application specific integrated circuit, field programmable gate array, digital circuit, analog circuit, combinations thereof, or other now known or later developed device for magnetic resonance reconstruction in parallel imaging with temporal sensitivity. The processor 50 is a single device or multiple devices operating in serial, parallel, or separately. The processor 50 may be a main processor of a computer, such as a laptop or desktop computer, or may be a processor for handling some tasks in a larger system, such as in an imaging system. The processor 50 is configured by instructions, design, hardware, and/or software to be able to perform the acts discussed herein, such as SPIRIT with temporal sensitivity (e.g., non-linear reconstruction based on coil sensitivities determined for different times from linear reconstruction and temporal filtering).

The display 54 is a monitor, LCD, projector, plasma display, CRT, printer, or other now known or later developed devise for outputting visual information. The display 54 receives images, graphics, or other information from the processor 50, memory 52, or MR system 48. One or more MR images are displayed. The images are of dynamic or moving tissue, such as the heart, but have similar artifact levels as linear reconstruction despite using a greater reduction factor. The images may be generated and displayed in real-time with the scanning of the patient. The images are generated within 1-5 seconds from the scanning, allowing viewing and diagnosis at the time of imaging the patient or while the patient is still in a position for further MRI. The pulse sequence and associated MR data may be acquired at various rates, such as about 20 times a second for dynamic imaging.

The signal-to-noise ratio (SNR) of images resulting from the SPIRIT with temporal sensitivity may be calculated. By using coil sensitivities from different times in SPIRiT, the SNR may be improved as compared to linear reconstruction.

Figure 4:
FIG. 4 is a medical image showing a mask.

To estimate SNR, a region of interest is masked or segmented. FIG. 4 shows an image representing a plane through a heart. The SNR for the dynamic heart is calculated only for the region within the added border. The SNR is estimated by performing a temporal Eigen analysis within the selected region. The mean signal is estimated as the square root of maximal Eigen value, and the noise is estimated as the square root of minimal Eigen value. Table 1 shows that the SNR of TSPIRIT (SPIRIT with temporal sensitivity) is largely improved compared to linear reconstruction.

TABLE 1

SNR measurement results.

|  | Linear recon | TSPIRIT |
|---|---|---|
| R3, relative SNR |  |  |
| Slice 1 | 1 | 1.2276 |
| Slice 2 | 1 | 1.1523 |
| Slice 3 | 1 | 1.0737 |
| Mean | 1 | 1.1512 |
| R4, relative SNR |  |  |
| Slice 1 | 1 | 1.4382 |
| Slice 2 | 1 | 1.3504 |
| Slice 3 | 1 | 1.3978 |
| Mean | 1 | 1.3955 |
| R5, relative SNR |  |  |
| Slice 1 | 1 | 1.5484 |
| Slice 2 | 1 | 1.6764 |
| Slice 3 | 1 | 1.6151 |
| Mean | 1 | 1.6133 |

*relative SNR is defined as SNR_TSPIRIT/SNR_Linear_recon

FIGS. 5A-F show images reconstructed using TSPIRIT (FIGS. 5B, D, and F) and linear methods (FIGS. 5A, C, and E). The TSPIRIT images show greater SNR, which is consistent with quantitative results of table 1. The artifacts of TSPIRIT, compared to linear results with same reduction factor, do not show significant increase.

Parallel imaging reconstruction using Self Consistent Parallel Imaging with Temporal Sensitivity Estimation (TSPIRIT) may provide real-time imaging with greater SNR and little to no increase in artifacts as compared to linear reconstruction in parallel imaging. In one embodiment used for the calculations of table 1 and the images of FIG. 5, the sensitivity information is estimated from the regularly interleaved Cartesian k-space sampling from the outcome of a linear GRAPPA reconstruction and Karhunen-Loeve transform. This coil sensitivity information is then used as an input for the nonlinear SPIRIT reconstruction, which is firstly solved using LSQR and then non-linear conjugate gradient. For in vivo real-time cine datasets, the SNR gain of TSPIRIT compared to linear GRAPPA reconstruction may be around 15%, 40% and 60% for reduction factors of 3, 4 and 5, while the artifacts do not show visible relative increase.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for parallel imaging with temporal sensitivity in magnetic resonance reconstruction, the method comprising:
   acquiring, with multiple coils, magnetic resonance data for parallel imaging over multiple phases of a physiological cycle, the magnetic resonance data representing a dynamic interior region of a patient;
   performing, for each of the multiple coils and each phase, an initial reconstruction;
   temporally filtering the initial reconstructions for each of the multiple coils;
   estimating a coil sensitivity for each of the multiple coils at each of the multiple phases from results of the temporally filtering;
   solving a non-linear reconstruction for each of the phases as a function of the coil sensitivities and the magnetic resonance data; and
   generating, from an output of the solving, a sequence of images representing the dynamic interior region.

2. The method of claim 1 wherein acquiring comprises acquiring the magnetic resonance data as interleaved with a reduction factor of four, five, or six.

3. The method of claim 1 wherein performing the initial reconstruction comprises performing a linear reconstruction of k-space data.

4. The method of claim 1 wherein temporally filtering comprises applying a Karhunen-Loeve transform.

5. The method of claim 4 wherein estimating from the results of the temporally filtering comprise estimating from only a first three modes output by the Karhunen-Loeve transform.

6. The method of claim 4 wherein performing the initial reconstruction comprises performing generalized auto calibrating partially parallel acquisitions reconstruction.

7. The method of claim 1 wherein estimating comprises estimating with an iterative self-constraint parallel imaging reconstruction calibration.

8. The method of claim 1 wherein solving the non-linear reconstruction comprises:
   applying a least square matrix inversion solver; and
   applying a non-linear conjugate gradient solver.

9. The method of claim 1 wherein solving comprises generating object space data for each of the multiple phases using the coil sensitivities for the respective phase.

10. The method of claim 1 wherein generating comprises generating each of the images from the magnetic resonance data from the multiple coils.

11. In a non-transitory computer readable storage medium having stored therein data representing instructions executable by a programmed processor for parallel imaging with temporal sensitivity in magnetic resonance reconstruction, the storage medium comprising instructions for:
   estimating coil sensitivities of an array of coils at different times from an outcome of linear reconstruction and filtering; and
   performing iterative self-consistent parallel imaging reconstruction from k-space data received with the array of coils, the performing being a function of the coil sensitivities at the different times.

12. The non-transitory computer readable storage medium of claim 11 wherein estimating the coil sensitivities comprises estimating the coil sensitivities from regularly interleaved Cartesian k-space sampling.

13. The non-transitory computer readable storage medium of claim 11 further comprising:
   linearly reconstructing data from interleaved k-space data for each coil of the array and for each of the different times;
   temporally filtering the linearly reconstructed data across the different times for each of the coils; and
   outputting the outcome from the temporally filtering.

14. The non-transitory computer readable storage medium of claim 13 wherein linearly reconstructing comprises performing generalized auto calibrating partially parallel acquisitions reconstruction and wherein temporally filtering comprises applying a Karhunen-Loeve transform, and wherein outputting comprises outputting only a first three modes of the Karhunen-Loeve transform.

15. The non-transitory computer readable storage medium of claim 13 wherein estimating the coil sensitivities comprises estimating kernels for the different times in calibration for the iterative self-consistent parallel imaging reconstruction.

16. The non-transitory computer readable storage medium of claim 13 wherein performing comprises performing with the coil sensitivities for each of the coils and each of the different times.

17. In a non-transitory computer readable storage medium having stored therein data representing instructions executable by a programmed processor for parallel imaging with temporal sensitivity in magnetic resonance reconstruction, the storage medium comprising instructions for:
   receiving, for coils of an array, interleaved k-space data in frames representing different phases;
   generating full k-space data for the frames;
   filtering the full k-space data;
   estimating self-consistent parallel imaging reconstruction kernels for the different phases from the filtered full k-space data; and
   solving a non-linear reconstruction from the interleaved k-space data and the kernels.

18. The non-transitory computer readable storage medium of claim 17 wherein solving comprises solving with a linear matrix inversion with LSQR and then a non-linear conjugate gradient iteration.

19. The non-transitory computer readable storage medium of claim 17 wherein generating the full k-space data comprises linearly reconstructing the full k-space data into a Cartesian sampling, and wherein filtering comprises temporally filtering with a Karhunen-Loeve transform.

20. The non-transitory computer readable storage medium of claim 17 wherein estimating comprises estimating for each of the frames.

* * * * *